(12) United States Patent
Fleizach et al.

(10) Patent No.: US 8,615,538 B1
(45) Date of Patent: Dec. 24, 2013

(54) SUB-FILTERING FINITE IMPULSE RESPONSE (FIR) FILTER FOR FREQUENCY SEARCH CAPABILITY

(75) Inventors: Gregory Fleizach, San Diego, CA (US); Ralph Hunt, San Marcos, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 571 days.

(21) Appl. No.: 12/719,881

(22) Filed: Mar. 9, 2010

(51) Int. Cl.
*G06F 17/10* (2006.01)

(52) U.S. Cl.
USPC .......................................... 708/300; 708/404

(58) Field of Classification Search
None
See application file for complete search history.

(56) References Cited

U.S. PATENT DOCUMENTS

| | | | |
|---|---|---|---|
| 4,701,934 A | 10/1987 | Jasper | |
| 5,694,388 A | 12/1997 | Sawahashi et al. | |
| 6,366,626 B1 | 4/2002 | Boyd | |
| 7,436,878 B1* | 10/2008 | Harris et al. | 375/142 |
| 2004/0042557 A1* | 3/2004 | Kabel et al. | 375/260 |

* cited by examiner

*Primary Examiner* — Michael D Yaary
(74) *Attorney, Agent, or Firm* — Kyle Eppele; Stephen E. Baldwin; Peter A. Lipovsky

(57) ABSTRACT

The present invention is directed to sub-filtering FIR (frequency impulse response) to provide the capabilities of an ambiguity function (i.e., search for a signal in time and frequency) without extensive computations. By minimizing the resources used for the signal search (increased efficiency), the size of the implementation of the ambiguity function in hardware, and thus its power consumption, can be reduced. Additionally, by making the frequency search more efficient, larger scale frequency searches are possible.

8 Claims, 1 Drawing Sheet

Sub-Filter Architecture

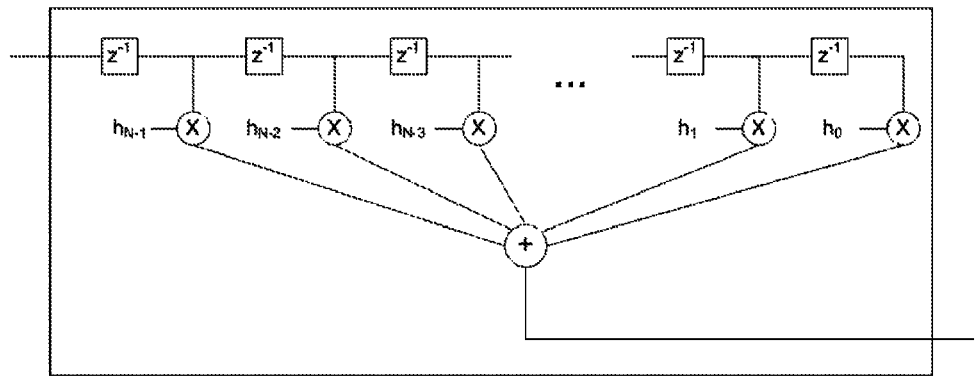
Figure 1: Direct-Form FIR Filter PRIOR ART
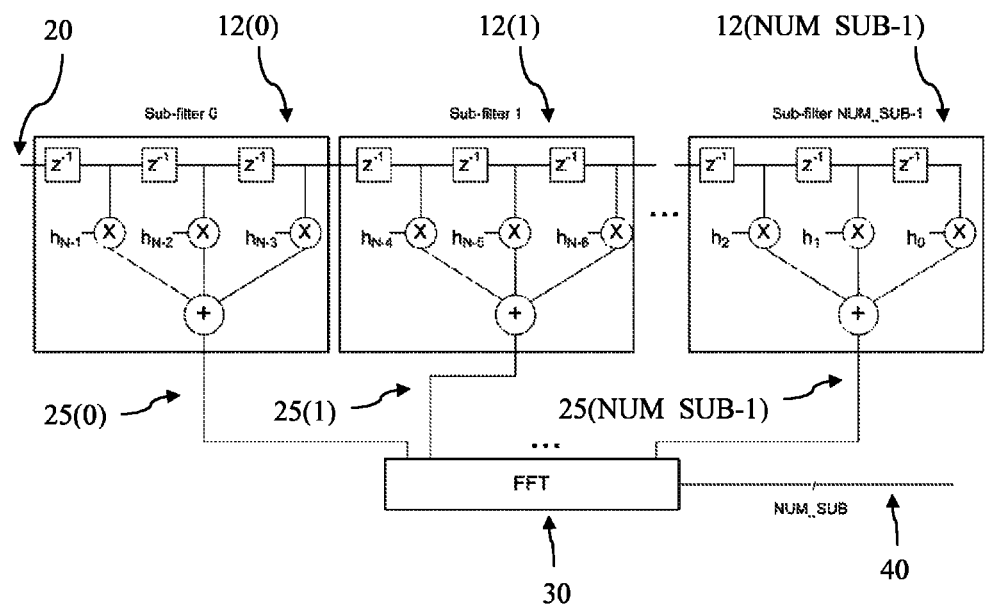
Figure 2: Sub-Filter Architecture

SUB-FILTERING FINITE IMPULSE RESPONSE (FIR) FILTER FOR FREQUENCY SEARCH CAPABILITY

FEDERALLY-SPONSORED RESEARCH AND DEVELOPMENT

This invention (Navy Case No. 100,332) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

BACKGROUND

A standard matched FIR (Finite Impulse Response) filter is shown below in FIG. 1 and given by the equation:

$$y_{k+(N-1)} = \sum_{n=0}^{N-1} h_n r_{k+n}$$

where h represents the filter coefficients, r represents the data to be filtered, and N is the length of the filter. In FIG. 1, the $z^{-1}$ symbol represents a unit delay operator, the X symbol represents a multiplier function, and the + symbol represents an adder function. Each data sample in the filter is multiplied by a tap coefficient and these products are summed to create a single output every time data is shifted in. In one realization of a complex multiplication, three FIR filters are needed to perform the four multiplications (using sums and differences). That is, three of the filters in FIG. 1 are needed in parallel.

The direct form FIR filter shown in FIG. 1 can be used as a matched filter for signal detection when the frequency of the received signal is known. In this case, the time of arrival of the signal is unknown (as well as the signal phase, typically). However, there are many applications (e.g., radar, satellite communications, etc.) where the frequency of received signal is unknown due to a Doppler frequency shift. Simply using one matched filter in these applications would result in a processing loss. To avoid this loss, a search for the signal must occur in time and frequency. This is called an ambiguity function. A standard ambiguity function equation is:

$$\chi(\tau, f) = \int_{-T/2}^{T/2} r(t)s*(t-\tau)\exp(-j2\pi ft)\, dt$$

where r is the received data, s is the signal that is being searched for, "*" denotes the complex conjugate, $\tau$ is the delay of the signal in the received data, f is the frequency shift of the signal in the received data, and T is the length of the received data.

The ambiguity function can be implemented in a number of ways. One standard implementation is to use a parallel bank of matched filters. The coefficients of each matched filter (i.e., the samples of the reference signal) are shifted in frequency from the coefficients of the other matched filters to perform detection at a specific frequency. In this implementation, the frequency shift between the coefficients of the different filters may be arbitrary, but is usually a compromise between processing loss and how many filters can be realized.

Another standard way of implementing an ambiguity function is to perform block processing using Fast Fourier Transforms (FFTs). This is also called the frequency-domain ambiguity function. In this method, a 2N-pt FFT of the reference signal is computed, where N is the length of the reference signal in samples. A matrix with circularly shifted versions of the reference FFT in each column is then generated. This sample shift in the frequency domain corresponds to a frequency shift in the time domain. Each sample shift corresponds to a frequency shift of 1/(2N·dt) Hz, where dt is the sample period. A block of data (often the length of the signal of interest) is captured and a 2N-pt FFT is performed. This FFT is multiplied point-by-point against the columns of the matrix and then the inverse FFT of each column is computed. The result is a matrix of the cross-correlations of the data against frequency-shifted versions of the reference signal. A new block of data is typically processed for every N input samples (i.e., not processed every sample).

A third implementation is called the time-domain ambiguity function. The data is shifted into a FIR filter and each data sample is multiplied by a filter coefficient. The FFT of the ensemble of these N products is then computed, which performs the frequency search. This may be repeated as often as every sample.

These three implementations are all essentially equivalent. The problem with these, and most, ambiguity function implementations is that they are resource-intensive. They require a significant amount of space in hardware, many computations, or both. In the matched filter bank, a filter is needed for every frequency of interest. Each filter has N taps, where N is the length of the signal, and every tap has a multiplier and an accumulator. In the frequency-domain approach an FFT twice the length of the reference, all the point-by-point multiplications, and an inverse FFT for each frequency of interest must be computed. In the time-domain approach, a FFT the length of the reference must be computed as often as every sample.

Another matched filter design modified to minimize frequency loss, such as described in U.S. Pat. No. 6,366,626, is specific to broadband, spread spectrum signals. It required a number of phase rotation-signal combiner stages and these each produced outputs associated with a number of frequency bins. Also, quantization of the phases for the combiner stages was necessary. Further, it lacked a means for accurately determining how many sub-filters were necessary for the frequency shift expected.

SUMMARY

The present invention is a finite impulse response (FIR) filter having a number of smaller, adjacent filters (i.e. sub-filters), and an FFT (Fast Fourier Transform) stage performing an FFT on the ensemble of outputs from the sub-filters. An ideal use for sub-filtering is to perform an ambiguity function (i.e., search over time and frequency) simply and with fewer resources than typical ambiguity function approaches.

BRIEF DESCRIPTION OF THE DRAWINGS

Throughout the several views, like elements are referenced using like references, wherein:

FIG. 1 shows a block diagram of a direct-form FIR filter.
FIG. 2 shows a block diagram of a sub-filter FIR architecture according to the present invention.

DETAILED DESCRIPTION OF THE EMBODIMENTS

The sub-filtering aspect of the present invention involves an FIR filter having a number of smaller, adjacent filters (i.e.

sub-filters), and performing a FFT on the ensemble of outputs from the sub-filters. An ideal use for sub-filtering is to perform an ambiguity function (i.e., search over time and frequency) simply and with fewer resources than typical ambiguity function approaches.

FIG. 2 shows a block diagram of an example of the sub-filtering approach of the present invention. FIG. 2 shows filter 10 with sub-filters 12 with three taps each, but this is just for demonstrative purposes.

The input 20 to the filter 10 is typically I/Q (In-phase/Quadrature) sequential data samples. The sub-filters 12 in FIG. 12 are designated 12(0), 12(1), . . . , 12(NUM_SUB−1). For illustrative purposes only, each sub-filter 12 in FIG. 2 includes three unit delay operators $z^{-1}$, three multipliers designated by "X" for multiplying the corresponding tap coefficients "h", and an adder designated by "+" for adding the multiplied coefficients. As will be understood from FIG. 2, sub-filter 12(0) receives I/Q samples 20 and passes the samples 20 through the three unit delay operators $z^{-1}$ to the three multipliers designated "X", where the corresponding tap coefficients $h_{N-1}$, $h_{N-2}$, and $h_{N-3}$ are multiplied and the multiplied components are passed to the adder designated "+", to form an output 25(0). The remaining sub-filters 12(1), . . . , 12(NUM_SUB−1) each pass received data samples to the input of its next (adjacent) sub-filter, and each operate in a similar manner, receiving the delayed data signals, and forming corresponding outputs 25(1), . . . , 25(NUM_SUB−1), as also would be understood.

In practice, the number of taps in each sub-filter 12 depends on the length of the original filter and the maximum Doppler shift, and hence the number of sub-filters, NUM_SUB, as explained below.

In the sub-filtering approach of the present invention, the coefficients "h" are the same as those that would be used in a standard FIR filter. The difference is that instead of taking the sum over the products of all the filter coefficients and data, the sum is only taken over small segments of each sub-filter 12.

Each sub-filter 12 acts as a self-contained filter, but passes the received data samples to the input of the next sub-filter, such as sub-filters 12(0), 12(1), . . . , 12(NUM_SUB−1). The outputs 25(0), 25(1), . . . , 25(NUM_SUB−1) of all the sub-filters 12 in FIG. 2 feed an FFT 30, and output of the FFT 30 is a frequency vector 40 with length equal to NUM_SUB (the number of sub-filters 12).

The number of sub-filters 12 utilized with the present invention is dictated by the bandwidth over the frequency search must be conducted (e.g., the maximum Doppler shift). For a filter 10 with N taps and a sample period of dt, the length of the filter 10 in time is N·dt=T seconds. Breaking the filter into NUM_SUB sub-filters 12 is like down-sampling the filter 10 to a sample period of $dt_{sub\_filter}$=T/NUM_SUB seconds. Thus, the new sampling frequency for the sub-filters 12 is:

$$f_{sub\_filter} = \frac{1}{(T/NUM\_SUB)}$$
$$= \frac{NUM\_SUB}{T} [Hz]$$

which is also the size of the frequency search window. Thus, the maximum Doppler frequency that can be searched is $f_{sub\_filter}/2$. What may be seen from the sub-filter sampling frequency is that it increases as the number of sub-filters 12 increases. Thus, when larger frequency windows must be searched, more sub-filters are necessary. This increases the size of the FFT that must be performed by FFT 30.

Note that the limiting case of the sub-filter method is when the number of sub-filters NUM_SUB is increased to the total length of the filter, N. This means that the received data is multiplied by each tap and then the FFT of the products is taken. This is equivalent to a time-domain ambiguity function approach. The size of the frequency search window is then the sample rate of the received data. However, signal frequency shifts are often much smaller than the sampling frequency.

The frequency resolution of any FFT is the number of samples divided by the sample rate. Thus, the FFT of the sub-filter outputs has resolution:

$$f_{res} = \frac{f_{sub\_filter}}{NUM\_SUB}$$
$$= \frac{\left(\frac{NUM\_SUB}{T}\right)}{NUM\_SUB}$$
$$= \frac{1}{T} [Hz]$$

which is independent of the number of sub-filters used. Instead, it is fixed based on the length of the filter in time. Note that the sub-filter frequency resolution is identical to the frequency resolution from the standard frequency-domain ambiguity function.

Thus, to choose how many sub-filters 12 are necessary, the maximum expected frequency shift, Δf (in Hz), is used. The necessary number of sub-filters to cover the maximum expected frequency shift is:

$$NUM\_SUB = \left\lceil \frac{\Delta f}{f_{res}} \right\rceil = \left\lceil \frac{\Delta f}{\left(\frac{1}{T}\right)} \right\rceil = \lceil T \cdot \Delta f \rceil$$

which will be an integer. If the number of sub-filters, NUM_SUB, does not divide the length of the reference signal, N, evenly then the last sub-filter 12 (N−1) can be zero-padded for convenience. That is, the extra taps that are not needed can be set to zero. Thus, any arbitrary number of sub-filters may be chosen.

The advantages of this new invention are that it significantly reduces the amount of processing necessary to compute an ambiguity function, and it does so with small loss. The frequency search capability is gained over a standard FIR filter with a minimal increase in computations. Other advantages are that it is applicable to any type of reference signal, broadband or otherwise, and no quantization of the sub-filters' phase rotations is necessary. Moreover, the sub-filtering approach of the present invention does not generate plural frequency bin outputs from a number of combiners, but instead produces a single output for each frequency bin from a single FFT 30.

Among the features of the present invention are 1) the use of a FFT after sub-filtering to provide frequency search capability (i.e., ambiguity function) for a FIR filter, 2) the method for choosing the amount of sub-filters to implement, and 3) it is not necessary to quantize the sub-filters' phase rotations.

The sub-filtering method may be applied to any type of FIR filter. It does not necessarily have to be a direct-form FIR filter. For example, sub-filtering may also be applied to other FIR architectures such as systolic, transposed, polyphase, and the like.

The FFT may be implemented in any number of ways. A customary way would be a Cooley-Tukey FFT over all the sub-filter outputs, but the FFT may be factored and computed with smaller FFTs and permutations.

The input to the FFT may be zero-padded to increase the frequency resolution of the output. This would result in a longer FFT to compute, but less loss as a result of increased frequency resolution.

From the above description, it is apparent that various techniques may be used for implementing the concepts of the present invention without departing from its scope. The described embodiments are to be considered in all respects as illustrative and not restrictive. It should also be understood that system is not limited to the particular embodiments described herein, but is capable of many embodiments without departing from the scope of the claims.

What is claimed is:

1. A finite impulse response (FIR) filter comprising:
a number N of adjacent sub-filters operating in parallel relative to each other, each of the sub-filters having a delay length including a number M of sequential unit delay operators for sequentially receiving I/Q data sample inputs and passing the I/Q data sample inputs from one delay operator to the next delay operator without accumulating any summed outputs between the passed I/Q data sample inputs through the respective delay operator such that passed data samples are delayed by the delay length of each sub-filter,
each sub-filter further including
an equal number M of coefficient taps and multipliers for sequentially multiplying each of the coefficient taps with the respective unit delayed input data samples to form corresponding multiplied components; and
an adder for sequentially adding the multiplied components to form sequential summed outputs from each respective sub-filter; and
an FFT stage receiving in parallel the summed outputs of all of the sub-filters to form a frequency vector with a frequency vector length equal to the number of sub-filters.

2. The filter of claim 1 where the FFT of the sub-filter outputs has the resolution 1/T where T is equal to the filter length of the filter in time independent of the number of sub-filters used.

3. The filter of claim 2 where the sub-filters perform an ambiguity function of searching over time and frequency.

4. The filter of claim 3 where the number of taps in each sub-filter corresponds to the filter length of the filter and the maximum Doppler shift.

5. The filter of claim 4 where the number of sub-filters NUM_SUB corresponds to the bandwidth over the frequency search being conducted and where the sampling frequency for the sub-filters is NUM_SUB/T.

6. The filter of claim 5 where the number of sub-filters is an integer expressed as $\lceil T \cdot \Delta f \rceil$ where $\Delta f$ is the maximum expected frequency shift.

7. The filter of claim 6 where the last sub-filter is zero-padded so that any arbitrary number of sub-filters can be chosen.

8. A finite impulse response (FIR) filter comprising:
a number N of adjacent sub-filters operating in parallel relative to each other, each of the sub-filters having a delay length including a number M of sequential unit delay operators for sequentially receiving I/Q data sample inputs and passing the I/Q data sample inputs from one delay operator to the next delay operator without accumulating any summed outputs between the passed I/Q data sample inputs through the respective delay operators such that passed data samples are delayed by the delay length of each sub-filter,
each sub-filter further including
an equal number M of coefficient taps and multipliers for sequentially multiplying each of the coefficient taps with the respective unit delayed input data samples to form corresponding multiplied components; and
an adder for sequentially adding the multiplied components to form sequential summed outputs from each respective sub-filter; and
an FFT stage receiving in parallel the summed outputs of all of the sub-filters to form a frequency vector with a frequency vector length equal to the number of sub-filters where the FFT of the sub-filter outputs has the resolution 1/T where T is equal to the filter length of the filter in time independent of the number of sub-filters used, where the number of taps in each sub-filter corresponds to the length of the filter and the maximum Doppler shift, the number of sub-filters NUM_SUB corresponds to the bandwidth over the frequency search being conducted and where the sampling frequency for the sub-filters is NUM_SUB/T filters.

* * * * *